US007022538B2

(12) United States Patent
Inoue

(10) Patent No.: US 7,022,538 B2
(45) Date of Patent: Apr. 4, 2006

(54) DISPLAY DEVICE AND MANUFACTURING METHOD FOR THE SAME

(75) Inventor: Satoshi Inoue, Suwa (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/775,894

(22) Filed: Feb. 10, 2004

(65) Prior Publication Data

US 2004/0159837 A1 Aug. 19, 2004

Related U.S. Application Data

(62) Division of application No. 09/999,163, filed on Nov. 30, 2001, now Pat. No. 6,806,496.

(30) Foreign Application Priority Data

Dec. 7, 2000 (JP) ............................ 2000-372219

(51) Int. Cl.
*H01L 21/00* (2006.01)

(52) U.S. Cl. ........................................................ 438/30

(58) Field of Classification Search ................... 438/30
See application file for complete search history.

(56) References Cited

U.S. PATENT DOCUMENTS 4,897,698 A * 1/1990 Zorinsky et al. ............ 257/526
5,917,199 A 6/1999 Byum et al.
6,372,608 B1 * 4/2002 Shimoda et al. ............ 438/455

FOREIGN PATENT DOCUMENTS

JP 10-125931 * 5/1998

OTHER PUBLICATIONS

Nuts & Volts Magazine, Jun. 2000, T & L Publications, vol. 21, nol. 6, pp 38.*

* cited by examiner

*Primary Examiner*—W. David Coleman
(74) *Attorney, Agent, or Firm*—Harness, Dickey & Pierce, P.L.C.

(57) ABSTRACT

A screwdriver is disclosed having a shaft with a screw holder. The screw holder is receivable in a recess in a screw head, and has a spring element which can be elastically deformed transverse to the longitudinal axis of the shaft. A portion of the spring element may be engaged with a bore in the shaft and the bore may penetrate the front end of the shaft. The elastic segment may be disposed in a groove parallel to the longitudinal axis of the shaft segment so that, in the unstressed state of the spring element, at least a portion of the elastic segment protrudes beyond the cross-sectional surface of the shaft segment to engage a surface of the screw head recess to thereby retain the screw on the shaft.

10 Claims, 5 Drawing Sheets

DISPLAY DEVICE AND MANUFACTURING METHOD FOR THE SAME

RELATED APPLICATIONS

This application is a division of U.S. application Ser. No. 09/999,163 filed on Nov. 30, 2001 now U.S. Pat. No. 6,806,496 which claims priority to Japanese Application No. 2000-372219 filed Dec. 7, 2000. The disclosures of the above applications are incorporated herein by reference.

BACKGROUND

1. Technical Field

The present invention relates to a display device and a manufacturing method therefor and, more particularly, to a device for performing desired display by using an electrophoretic ink, and a manufacturing method therefor.

2. Background Art

Display devices driven by semiconductor elements have been manufactured by utilizing advanced equipment, such as a high vacuum apparatus.

However, utilizing such advanced equipment poses a problem of high manufacturing cost for the display devices driven by the semiconductor elements.

SUMMARY OF THE INVENTION

An object of the present invention is to provide a display device that can be manufactured at lower cost, and a manufacturing method for the same.

A display device in accordance with the present invention includes a pixel electrode and a transistor for applying a voltage to the pixel electrode, wherein at least an active layer of the transistor is formed of an organic material.

Furthermore, a manufacturing method for the display device in accordance with the present invention includes a step for providing a source line around a pixel electrode provided on a substrate, a step for forming an insulating film pattern having an opening of a region for a source and a drain, a step for forming the source and the drain, a step for providing a semiconductor film on the source and the drain, and a step for providing a gate on the semiconductor film, the respective steps being implemented substantially under atmospheric pressure.

DETAILED DESCRIPTION

Figure 1:
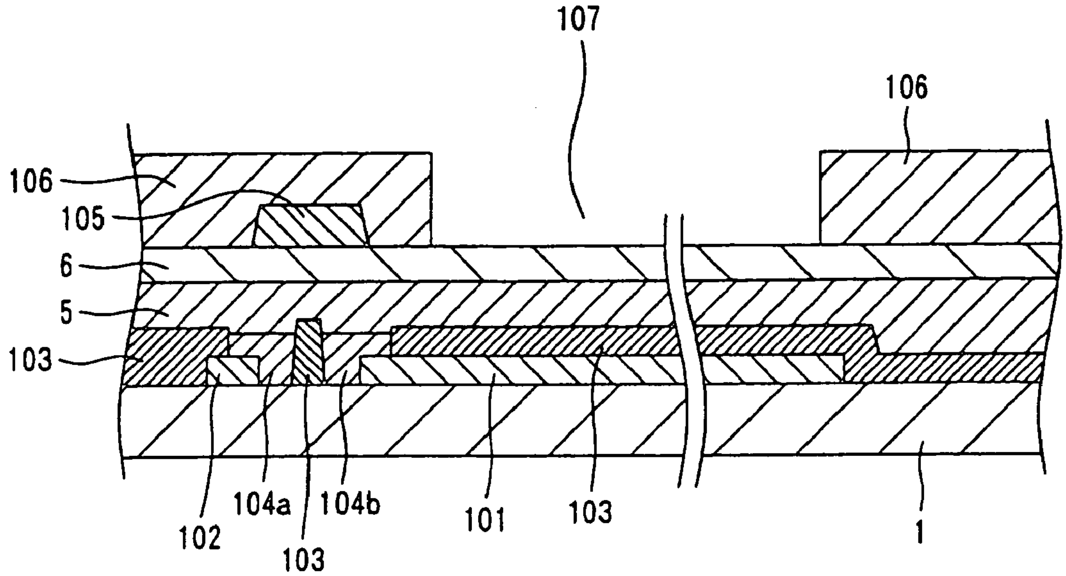
FIG. 1 is a sectional view showing an embodiment of a display device in accordance with the present invention.

A display device in accordance with the present invention that includes a pixel electrode and a transistor for applying a voltage to the pixel electrode is characterized in that at least an active layer of the transistor is formed of an organic material.

A preferred embodiment of the display device may be provided with a film for protecting a gate of the transistor and an electrophoretic ink layer provided on the provided film and the pixel electrode. This arrangement permits the manufacture to be implemented substantially under atmospheric pressure; therefore, no special apparatus, such as a vacuum chamber, is required, making it possible to manufacture the display device at lower cost.

A manufacturing method for a display device in accordance with the present invention includes a step for providing a source line around a pixel electrode provided on a substrate, a step for forming an insulating film pattern having an opening of a region for a source and a drain, a step for forming the source and the drain, a step for providing a semiconductor film on the source and the drain, and a step for providing a gate on the semiconductor film, and the manufacturing method is characterized in that the respective steps are implemented substantially under atmospheric pressure. Since manufacture substantially under atmospheric pressure is possible, no special apparatus, such as a vacuum chamber, is required, enabling a display device to be manufactured at lower cost.

In a preferred embodiment, a step for electrolytically plating the source line may be added to the aforesaid manufacturing method. Performing the electrolytic plating makes it possible to prevent static electricity.

Furthermore, in a preferred embodiment, a step for providing a film for protecting the gate and a step for applying electrophoretic ink after providing the film may be added to the aforesaid manufacturing method. Providing the film allows a transistor portion to be protected. In the step for providing the film for protecting the gate, the film is provided by lamination.

Using a resin film with the pixel electrode for the substrate makes it possible to implement a flexible display device.

According to the present invention, as another manufacturing method for a display device, there is provided a manufacturing method for a display device having a terminal for receiving an external signal, including a step for providing a protective film on the surface of the terminal, a step for forming a display region in a state wherein the protective film has been provided, and a step for removing the protective film, the surface of the terminal being exposed.

Preferably, the protective film is a seal attached to the terminal and removed by peeling the seal, or the protective film is an insulating film and the insulating film provided on the terminal is removed by laser irradiation, or the protective film is a seal attached to the terminal and the seal is heated to produce a gas, which causes the seal to be removed by peeling. Adopting these exposing methods allows the terminal to be easily exposed.

Referring now to the accompanying drawings, an embodiment of the present invention will be described more specifically. In the drawings to be referred to in the following description, the components similar to those in other drawings will be denoted by the same reference numerals. The descriptions will be given in the following order: (1) the sectional structure of an organic TFT display device, (2) a manufacturing method for the organic TFT display device, and (3) a method for exposing an external terminal.

(1) Sectional Structure of an Organic TFT Display Device

FIG. 1 is a sectional view showing an embodiment of the display device in accordance with the present invention. As shown in the drawing, the display device according to the embodiment has a pixel electrode 101 and a source line 102 formed of ITO or the like, an insulating film 103, a source 104*a* and a drain 104*b*, a semiconductor layer 5, an insulating film 6, and a gate 105 that are deposited on a substrate 1 in the order in which they are listed.

In the present invention, a protective film 106 is provided to protect the transistor portion, including the gate 105. The protective film 106 is a lattice type film provided with an opening 107 in a portion that corresponds to the pixel electrode 101. By attaching the film 106, the transistor portion can be protected. Furthermore, applying electrophoretic ink onto the film 106 also causes the electrophoretic ink to enter the opening 107.

Figure 2:
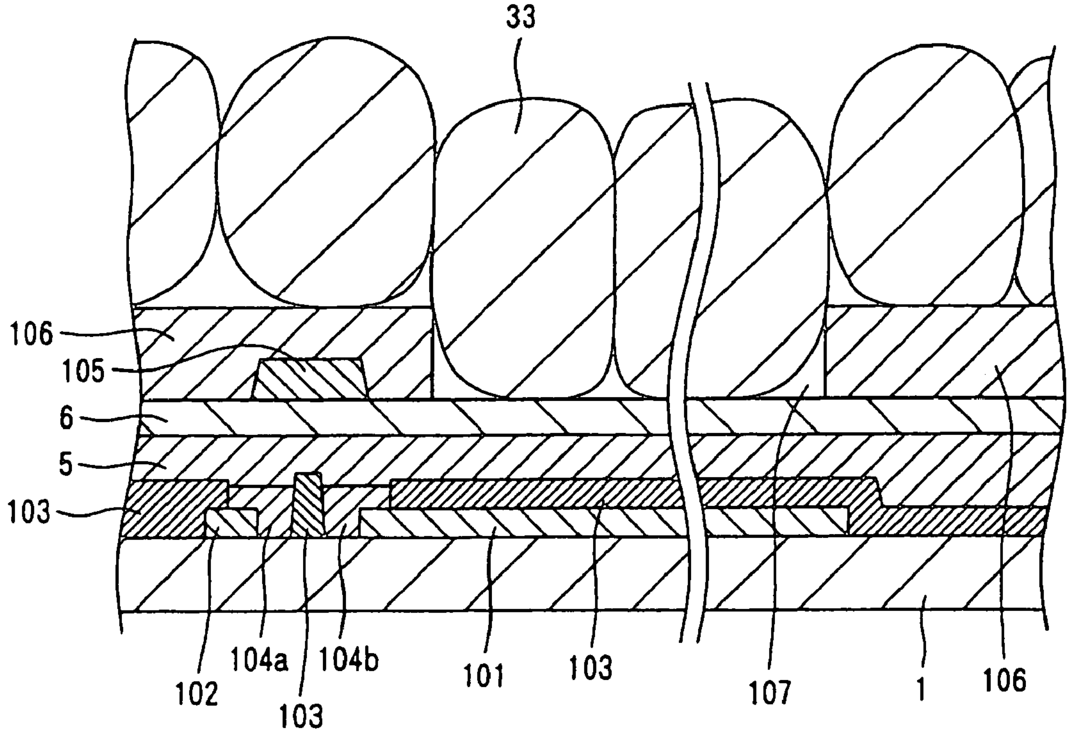
FIG. 2 is a diagram showing a state wherein an electrophoretic ink has been applied.

The electrophoretic ink may be directly disposed at the opening 107. In this embodiment, however, the electrophoretic ink is sealed in a microcapsule. A liquid containing the microcapsule and a binder is applied. FIG. 2 shows a state wherein the electrophoretic ink has been applied. As shown in the drawing, the electrophoretic ink is sealed in a microcapsule 33, and the microcapsule 33 is disposed also at the opening 107. An electrode, which is not shown, is further formed, and a voltage is applied to the microcapsule 33 by the electrode and the pixel electrode 101. The application of the voltage electrically polarizes the electrophoretic ink in the microcapsule 33, permitting desired display to be performed, as will be discussed hereinafter.

Since the protective film 106 is a lattice type film, the lattice may be seen by an observer during display; however, this will not pose a problem because the pixel is larger (the opening 107 is larger) in a display device or the like having a large screen. The protective film 106 may be attached by laminating. Providing the lattice type protective film 106 makes it possible to prevent short-circuiting of a gate electrode portion or other wiring, and also to improve image quality, leading to improved reliability of a TFT.

In such a configuration, a voltage applied to the gate 105 causes a channel to be formed in the semiconductor layer 5, turning the transistor ON. This brings the source 104*a* and the drain 104*b* into conduction, and a predetermined voltage is applied between the pixel electrode 101 and a transparent electrode, which is not shown. The application of the voltage electrically polarizes the electrophoretic ink in the opening 107, thus performing desired display.

Figure 3:
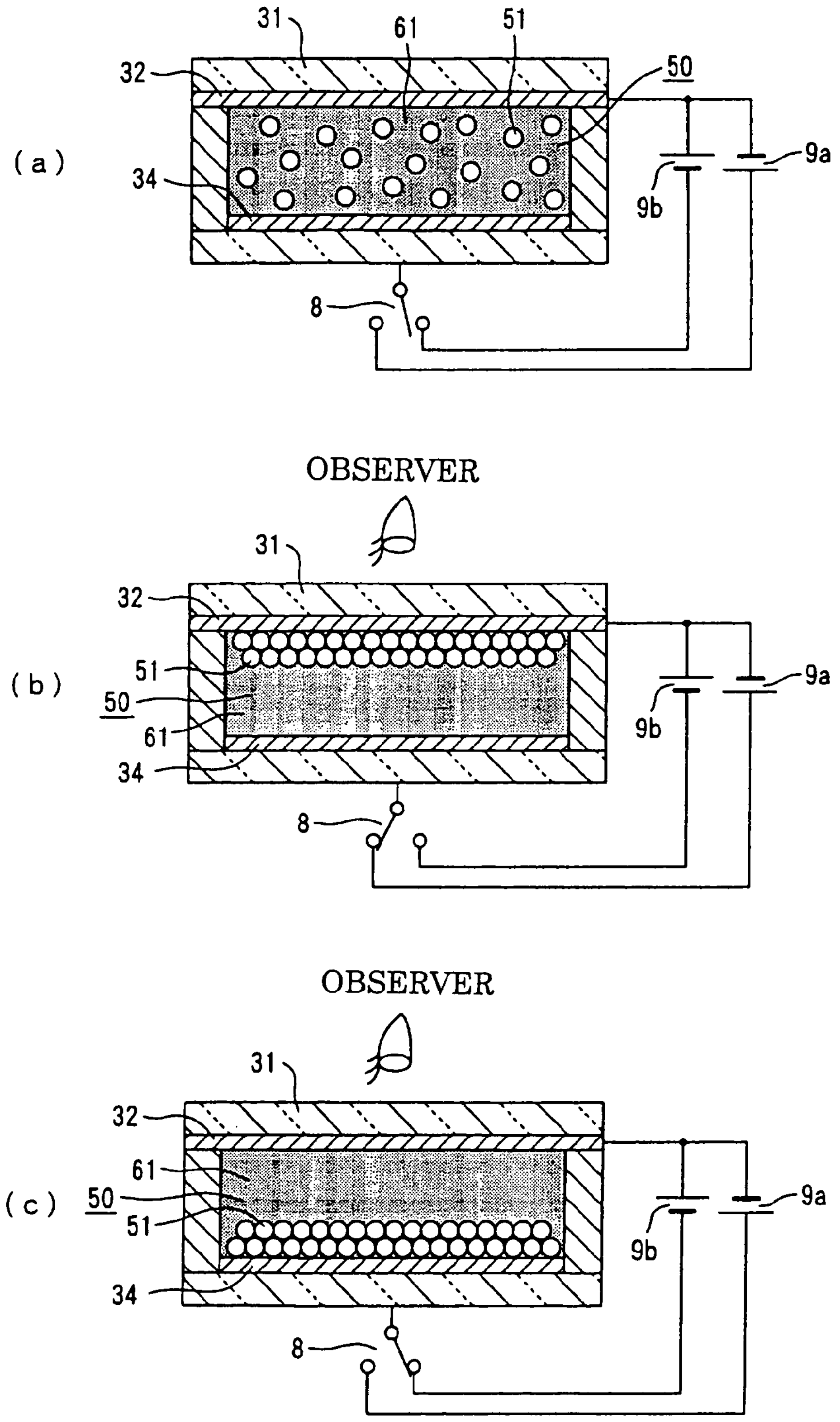
FIG. 3 is a diagram illustrating a displaying principle of the display device using the electrophoretic ink.

The electrically polarized condition will be described with reference to FIG. 3. The drawing illustrates an electrically polarized condition of a single microcapsule. In (a) of the drawing, an electrophoretic ink 50 in the microcapsule exists between an electrode 34 and a transparent electrode 32. The electrophoretic ink 50 is constituted by a liquid phase dispersion medium 61 and electrophoretic particles 51 dispersed in the liquid phase dispersion medium 61. The pigmentation of the liquid phase dispersion medium 61 and that of the electrophoretic particles 51 are to be of different colors.

Voltage sources 9*a* and 9*b* for applying voltages in opposite directions from each other are connected through the intermediary of a switch 8. More specifically, the electrode 32 is connected to one end of each of the voltage sources 9*a* and 9*b*, while the electrode 34 is connected to the other end of each of the voltage sources 9*a* and 9*b* through the intermediary of the switch 8. With this connection, the direction of a voltage to be applied can be changed by switching the switch 8. By changing the direction of the voltage to be applied, the electrophoretic dispersion liquid can be polarized so as to perform desired display.

More specifically, as shown in (b) of the drawing, by applying a voltage from the voltage source 9*a*, the electrophoretic particles 5 can be collected at the transparent electrode 32, which is closer to an observer. Under this condition, the observer sees the color of the electrophoretic particles 51. On the other hand, as shown in (c) of the drawing, by applying a voltage from the voltage source 9*b*, the electrophoretic particles 51 can be collected at the electrode 34, which is farther from the observer. Under this condition, the observer sees the color of the liquid phase dispersion medium 61.

Thus, by electrically polarizing the electrophoretic ink 50 in the microcapsules, two types of colors that correspond to the directions in which a voltage is applied can be displayed. Hence, desired display can be accomplished at each pixel, so that applying the configuration shown in FIG. 1 to all pixels permits a display device to be realized. Moreover, using a flexible material for the substrate 1 makes it possible to implement a flexible display device.

(2) Manufacturing Method for the Organic TFT Display Device

The manufacturing method for the display device having the sectional structure shown in FIG. 1 will be described with reference to FIG. 4 through FIG. 7.

Figure 4:
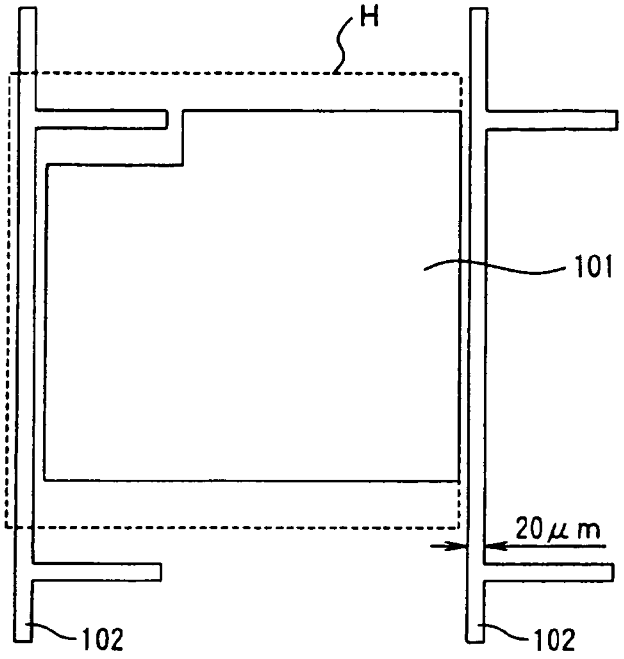
FIG. 4 is a process diagram illustrating a manufacturing method for a display device having the sectional structure shown in FIG. 1.

First, as shown in FIG. 4, a source line 102 formed of ITO or the like is provided around the pixel electrode 101 formed of ITO or the like provided on the substrate. The line width of the source line 102 is, for example, 20 μm. As the material for the substrate, PET (polyethylene terephthalate), for example, is used. The area indicated by a dotted line H in the drawing corresponds to one pixel.

The pixel electrode 101 may be formed on the substrate, or a substrate with the pixel electrode already formed thereon may be purchased and used. The source line 102 may be provided with electrolytic plating. This makes it possible to reduce wire resistance and improve operating speed. The plating can be also expected to function as a countermeasure for static electricity.

Figure 5:
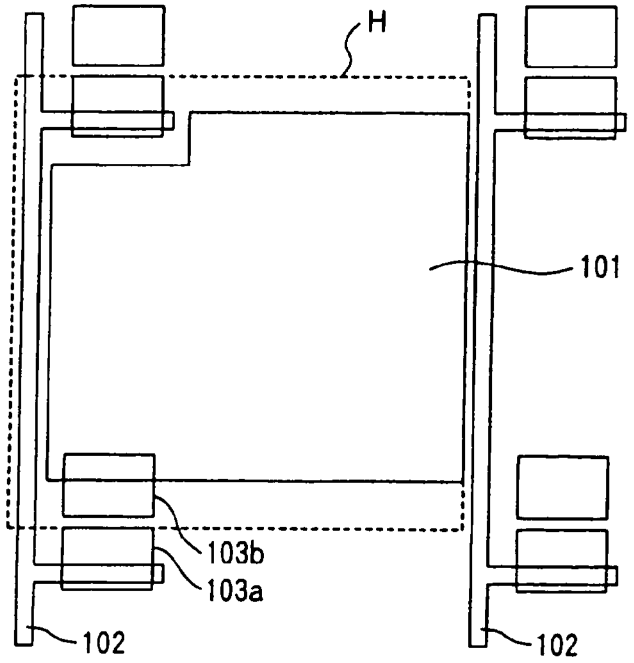
FIG. 5 is another process diagram illustrating the manufacturing method for the display device having the sectional structure shown in FIG. 1.

Next, as shown in FIG. 5, an insulating film is formed, that has regions 103*a* and 103*b* opened, which will provide a source and a drain, respectively. For the insulating film, polyimide (hereinafter referred to as "PI"), for example, is used.

Figure 6:
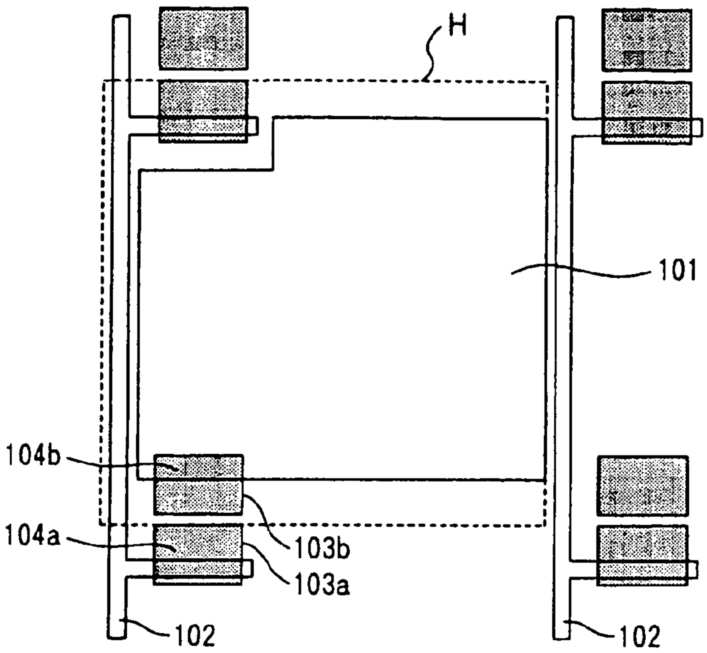
FIG. 6 is yet another process diagram illustrating the manufacturing method for the display device having the sectional structure shown in FIG. 1.

Further, as shown in FIG. 6, the source 104*a* and the drain 104*b* are formed in the opened regions 103*a* and 103*b*. The source 104*a* and the drain 104*b* may use palladium as their material. In this embodiment, the source and drain are formed by injecting an electrically conductive liquid into the regions 103*a* and 103*b*. For this formation, an ink jet method may be used. As the electrically conductive liquid, a solution containing, for example, polyethylene dioxythiophene (hereinafter referred to as "PEDOT") dissolved in a solvent is used.

Figure 7:
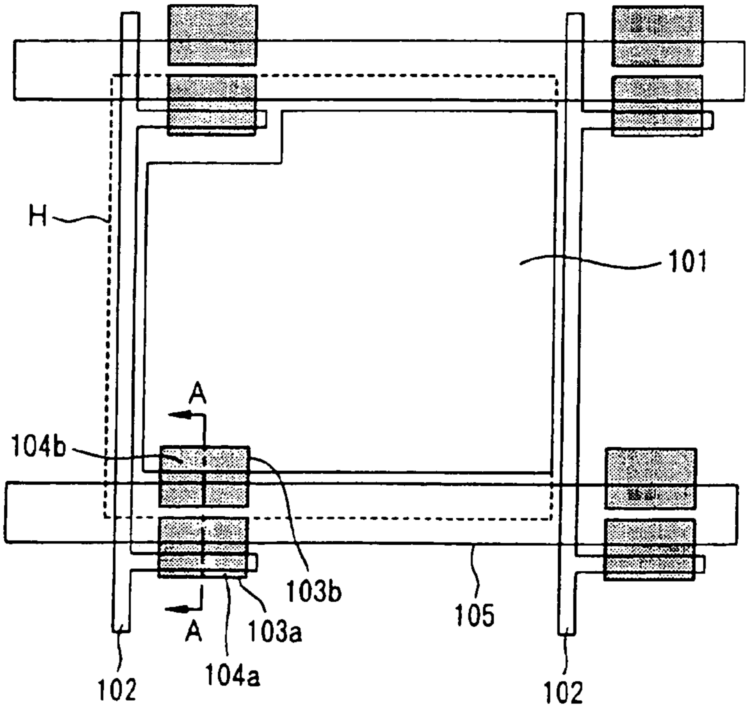
FIG. 7 is still another process diagram illustrating the manufacturing method for the display device having the sectional structure shown in FIG. 1.

And, as shown in FIG. 7, a semiconductor film and an insulating film are formed in this order on the source 104*a* and the drain 104*b*. Lastly, the gate 105 is formed on the insulating film. The semiconductor film is formed using, for example, pentacene. For the insulating film, silicon oxide ($SiO_2$) is used. The gate 105 uses nickel, for example, as its material, and is formed by the ion beam sputtering method. Alternatively, the photolithography may be used for the formation. The gate 105 may be formed also by using the ink jet method. In this case, an electrically conductive liquid, such as PEDOT, may be used. The line width of the gate 105 is, for example, 50 μm.

In the state shown in FIG. 7, as described above with reference to FIG. 1, the lattice type protective film 106 having the opening 107 in the portion corresponding to the pixel electrode 101 is attached. And, the electrophoretic ink is applied onto the attached protective film 106, as described above with reference to FIG. 2. An electrode, which is not shown, is further provided on the applied electrophoretic ink. Then, by applying a voltage, as described above, between the electrode, which is not shown, and the pixel electrode 101, desired display can be performed.

Manufacturing the organic TFT display device according to the foregoing process allows all steps to be implemented under the atmospheric pressure by using the ink jet method or the like. Hence, no special apparatus, such as a vacuum chamber, is required, permitting the manufacture to be accomplished at lower cost. The range of "substantially under atmospheric pressure" according to the present invention includes "in a liquid" and "a clean room".

Figure 8:
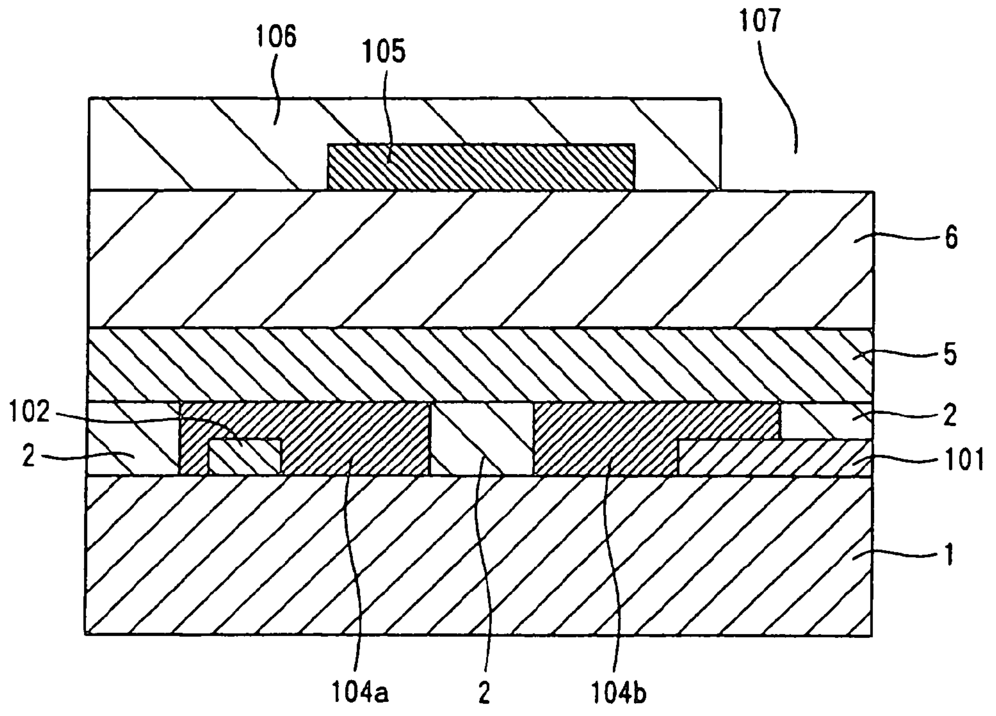
FIG. 8 is a diagram illustrating the sectional structure taken along the line A—A shown in FIG. 7.

FIG. 8 schematically shows the sectional structure of a portion taken at the line A—A in FIG. 7. As shown in the drawing, the section A—A includes a substrate 1, an insulating film 2 made of PI or the like formed on the substrate 1, a source line 102, a source 104*a*, the pixel electrode 101, and the drain 104*b*, which are formed in the same layer as the insulating film 2, the semiconductor layer 5, the insulating layer 6, the gate 105, and the protective film 106 covering the gate 105. The portion above the pixel electrode 101 is not covered by the protective film 106, and this portion provides the aforesaid opening 107. Here, the thicknesses of the source 104*a* and the drain 104*b* are 60 nm, and the distance between the source 104*a* and the drain 104*b* is, for example, 100 to 200 μm. The thickness of the semiconductor layer 5 is, for example, 60 nm, the thickness of the insulating film 6 is, for example, 1 μm, and the thickness of the gate 105 is, for example, 45 nm.

(3) Method for Exposing an External Terminal

In the display device manufactured according to the aforesaid process, the electrophoretic ink is applied by the ink jet method or the like; therefore, it is necessary to provide beforehand a terminal for receiving signals to be displayed from the outside and to expose the terminal. To expose such a terminal, a protective film is provided in advance on a terminal portion, and a display region or the like is formed with the protective film provided. After the display region or the like is formed, the protective film is removed to expose the surface of the terminal.

In short, according to the manufacturing method for the organic TFT display device having the terminal for receiving external signals, the surface of the terminal is provided with the protective film, the display region is formed with the protective film provided, then the protective film is removed to expose the surface of the terminal.

Figure 9:
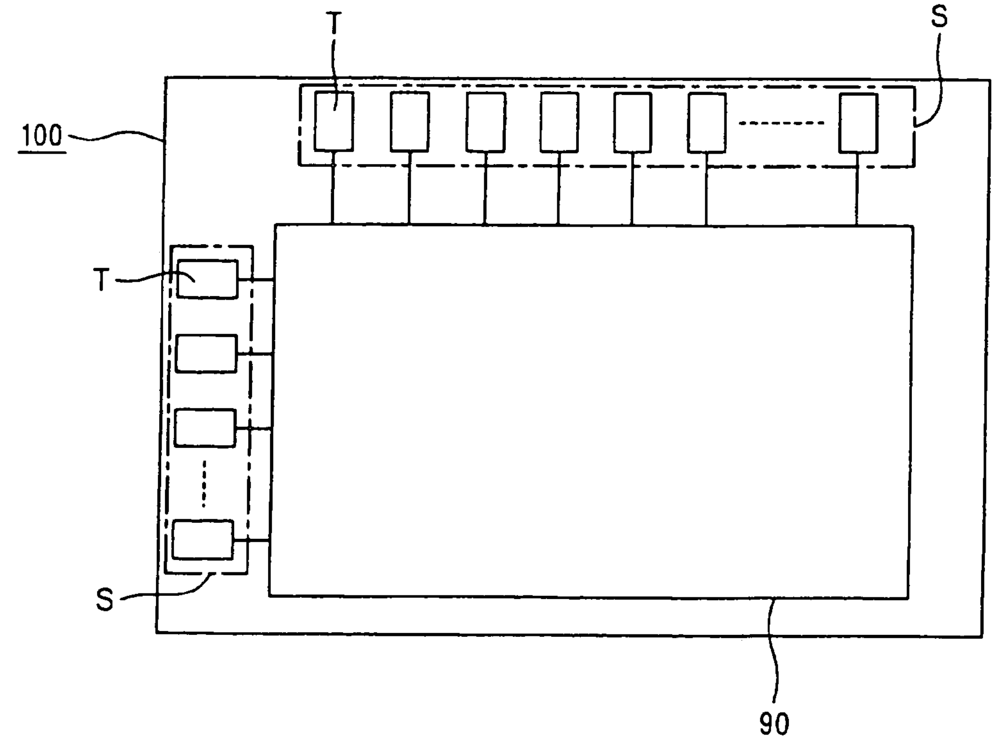
FIG. 9 is a diagram illustrating a method for exposing an external terminal in the display device using the electrophoretic ink.

For instance, as shown in FIG. 9, the surface of a display device 100 is provided with a plurality of terminals T extending from a display region 90, which is also provided on the surface. Hence, before applying the electrophoretic ink, the terminals T are covered with a protective film S, and the protective film S is peeled off after the electrophoretic ink is applied.

For the protective film, a protective sheet (so-called "seal"), for example, may be used. In other words, the terminals are masked by attaching the sheet, then the sheet is peeled off after the display region or the like is formed. In this case, as the protective sheet, Revalpha (trade name), which is a thermal release sheet manufactured by Nitto Denko Corporation, for example, is used. This thermal release sheet is formed of a polyester base material with a thermal release adhesive agent applied to the base material. The sheet loses its adhesive force and peels when heat of about 90° C. is applied to the sheet after it is attached.

Alternatively, an insulating film may be formed on the terminal T portion, and the insulating film may be removed by laser irradiation or the like later.

Adopting the aforesaid exposing method allows the terminals to be easily exposed without using the photolithography technology. It is obvious that the method for exposing the external terminals explained above can be applied not only to electrophoretic ink, but also extensively to the manufacturing methods for display devices that include a step for applying a liquid.

As described above, according to the present invention, by adopting the aforesaid sectional structure, by manufacturing according to the aforesaid method, and by exposing the external terminals according to the aforesaid method, all manufacturing process steps can be implemented substantially under atmospheric pressure without using any special apparatus, such as a vacuum chamber, thus providing an advantage in that organic TFT display devices can be manufactured at lower cost.

What is claimed is:

1. A manufacturing method for a display device comprising:

a step for providing a source line around a pixel electrode provided on a substrate;

a step for forming an insulating film pattern having openings for a source and a drain;

a step for forming the source and the drain; and a step for providing a semiconductor film on the source and the drain; and a step for providing a gate on the semiconductor film;

wherein the respective steps are implemented substantially under atmospheric pressure.

2. The manufacturing method according to claim 1, further comprising a step for electrolytically plating the source line.

3. The manufacturing method according to claim 1, further comprising a step for providing a film for protecting the gate and a step for applying electrophoretic ink after the film is provided.

4. The manufacturing method according to claim 3, wherein the film is provided by laminating in the step for providing the film for protecting the gate.

5. The manufacturing method according to claim 1, the semiconductor film being formed over the source and the drain.

6. A manufacturing method for a display device, the method comprising:

forming a source line on a substrate;

forming a source and a drain of a transistor on the substrate;

forming a semiconductor film contacting the source and the drain; and providing a gate of the transistor;

wherein the source line, the source, the drain, the semiconductor film, and the gate are implemented substantially under atmospheric pressure.

7. The manufacturing method according to claim 6, the forming of source line is implemented by electrolytic plating.

8. The manufacturing method according to claim 6, further comprising:

forming a film covering the gate; and applying an electrophoretic ink to the film.

9. The manufacturing method according to claim 8, the forming of the film is implemented by lamination coating.

10. The manufacturing method according to claim 6, the substrate is a resin film with the pixel electrode.

* * * * *

UNITED STATES PATENT AND TRADEMARK OFFICE

CERTIFICATE OF CORRECTION

PATENT NO. : 7,022,538 B2
APPLICATION NO. : 10/775894
DATED : April 4, 2006
INVENTOR(S) : Satoshi Inoue It is certified that error appears in the above-identified patent and that said Letters Patent is hereby corrected as shown below:

#57

Title Page, Abstract, Lines 1-14: Delete entire Abstract and insert -- In a manufacturing method in which a source line is provided around a pixel electrode provided on a substrate, an insulating film having open regions that will provide a source and a gate is formed, the source and the drain are formed, and a semiconductor film and a gate are provided on the source and drain, the above constituents are formed substantially under atmospheric pressure. Since manufacture can be accomplished substantially under the atmospheric pressure, no special apparatus, such as a vacuum chamber, is required, permitting a display device to be manufactured at lower cost. --

Signed and Sealed this

Twenty-second Day of August, 2006

JON W. DUDAS
*Director of the United States Patent and Trademark Office*